(12) United States Patent
Kawanishi et al.

(10) Patent No.: US 11,594,743 B2
(45) Date of Patent: Feb. 28, 2023

(54) METHOD OF INSPECTING SHORT CIRCUIT OF ELECTROLYTE MEMBRANE AND APPARATUS FOR INSPECTING SHORT CIRCUIT OF ELECTROLYTE MEMBRANE

(71) Applicant: HONDA MOTOR CO., LTD., Tokyo (JP)

(72) Inventors: Hiroaki Kawanishi, Wako (JP); Hiroyuki Yamagishi, Tokyo (JP)

(73) Assignee: Honda Motor Co., Ltd., Tokyo (JP)

( * ) Notice: Subject to any disclaimer, the term of this patent is extended or adjusted under 35 U.S.C. 154(b) by 0 days.

(21) Appl. No.: 17/356,859

(22) Filed: Jun. 24, 2021

(65) Prior Publication Data

US 2021/0408565 A1 Dec. 30, 2021

(30) Foreign Application Priority Data

Jun. 25, 2020 (JP) .............................. JP2020-109469

(51) Int. Cl.
*G01R 31/389* (2019.01)
*H01M 8/04664* (2016.01)

(52) U.S. Cl.
CPC ...... *H01M 8/04671* (2013.01); *G01R 31/389* (2019.01)

(58) Field of Classification Search
None
See application file for complete search history.

(56) References Cited

U.S. PATENT DOCUMENTS

2018/0159161 A1\* 6/2018 Kojima ............... H01M 8/1004
2019/0041468 A1\* 2/2019 Katoh .................. G01R 31/374

FOREIGN PATENT DOCUMENTS

JP 2018-160371 A 10/2018

\* cited by examiner

*Primary Examiner* — Jas A Sanghera
(74) *Attorney, Agent, or Firm* — Carrier Shende & Associates, P.C.; Joseph P. Carrier; Jeffrey T. Gedeon

(57) ABSTRACT

A method of inspecting short circuit of an electrolyte membrane by a short circuit inspection apparatus includes an obtaining step of performing a process of obtaining the energization state of a limited range including divided portions that are adjacent to each other in a range which is smaller than the entire range of the plurality of divided portions, for each of a plurality of limited ranges provided at different positions, and a determination step of determining whether or not a short circuit portion is present in the electrolyte membrane based on the energization state of the plurality of limited ranges.

9 Claims, 12 Drawing Sheets

METHOD OF INSPECTING SHORT CIRCUIT OF ELECTROLYTE MEMBRANE AND APPARATUS FOR INSPECTING SHORT CIRCUIT OF ELECTROLYTE MEMBRANE

CROSS-REFERENCE TO RELATED APPLICATION

This application is based upon and claims the benefit of priority from Japanese Patent Application No. 2020-109469 filed on Jun. 25, 2020, the contents of which are incorporated herein by reference.

BACKGROUND OF THE INVENTION

Field of the Invention

The present invention relates to a method of inspecting short circuit of an electrolyte membrane and an apparatus for inspecting short circuit of the electrolyte membrane.

Description of the Related Art

A solid polymer electrolyte fuel cell includes an electrolyte membrane member including an electrolyte membrane interposed between a pair of electrode catalyst layers. The electrolyte membrane comprises solid polymer having proton conductivity. For example, JP 2018-160371 A discloses a method of, and an apparatus for inspecting short circuit of an electrolyte membrane. Inspection of short circuit is performed by causing electrical current to flow through an electrolyte membrane member to determine whether or not there is any short circuit portion in the electrolyte membrane.

The short circuit inspection apparatus for inspecting short circuit of the electrolyte membrane disclosed in JP 2018-160371 A includes a plurality of first measurement terminal units electrically connected to one of electrode catalyst layers and a second measurement terminal unit electrically connected to the other of the electrode catalyst layers. In the state where the plurality of first measurement terminal units are electrically insulated from each other, the first measurement terminal units are disposed in a matrix pattern. Then, in the short circuit inspection apparatus for inspecting short circuit of the electrolyte membrane disclosed in JP 2018-160371 A, voltage is applied between the plurality of first measurement terminal units and the second measurement terminal unit, and electrical current flowing through portions of the electrolyte membrane member facing the plurality of first measurement terminal units (plurality of divided portions) is measured.

SUMMARY OF THE INVENTION

In the conventional technique, in the case where a short circuit portion such as a pinhole is present in any of a plurality of divided portions formed by dividing the electrolyte membrane member in the surface direction (portions of the electrolyte membrane member corresponding to the plurality of first measurement terminal units), it is possible to accurately determine whether or not the short circuit portion is present in the electrolyte membrane. However, in the case where a short circuit portion is present between the divided portions of the electrolyte membrane member that are adjacent to each other (portion of the electrolyte membrane member facing the insulating portions, each of which is disposed between the first measurement terminal units that are adjacent to each other), the electrical current which flowed through the short circuit portions is distributed to the plurality of first measurement terminal units, and flows through the plurality of first measurement terminal units. Therefore, there is a concern that it may not be possible to accurately detect such short circuit portions.

The present invention has been made taking such a problem into account, and an object of the present invention is to provide a method of inspecting short circuit of an electrolyte membrane, and an apparatus for inspecting short circuit of the electrolyte membrane in which, even in the case where a short circuit portion is present between divided portions of an electrolyte membrane member that are adjacent to each other, it is possible to determine whether or not the short circuit portion is present in the electrolyte membrane.

According to an aspect of the present invention, a method of inspecting short circuit of an electrolyte membrane is provided. The method is performed by energizing an electrolyte membrane member having a solid polymer electrolyte membrane, for inspecting whether or not a short circuit portion is present in the electrolyte membrane. The method includes an energizing step of energizing a plurality of divided portions formed by dividing the electrolyte membrane member in a surface direction, through a pair of measurement terminal units disposed on both surfaces of the electrolyte membrane member, an obtaining step of performing a process of obtaining a energization state for each of a plurality of limited ranges provided at different positions of electrolyte membrane member, each of the limited ranges including divided portions that are adjacent to each other in a range which is smaller than the entire range of the plurality of divided portions, and a determining step of determining whether or not the short circuit portion is present in the electrolyte membrane based on the energization state of the plurality of limited ranges obtained in the obtaining step.

According to another aspect of the present invention, an apparatus for inspecting short circuit of an electrolyte membrane is provided. The short circuit inspection apparatus energizes an electrolyte membrane member having a solid polymer electrolyte membrane, for inspecting whether or not a short circuit portion is present in the electrolyte membrane. The apparatus includes a first measurement terminal unit and a second measurement terminal unit configured to hold the electrolyte membrane member, a power supply configured to cause energization between the first measurement terminal unit and the second measurement terminal unit, and an obtaining unit configured to obtain an energization state of the electrolyte membrane member, and a determining unit configured to determine whether or not the short circuit portion is present in the electrolyte membrane based on the energization state obtained by the obtaining unit. A plurality of the first measurement terminal units are disposed in a state where the first measurement terminal units are insulated from each other. The obtaining unit is configured to obtain the energization state of a limited range including divided portions that are adjacent to each other in a range which is smaller than the entire range of a plurality of divided portions of the electrolyte membrane member facing the first measurement terminal units.

In the present invention, the energization state in the limited range including the divided portions that are adjacent to each other in a range which is smaller than the entire range of the plurality of divided portions of the electrolyte membrane member is obtained. Therefore, even in the case where a short circuit portion is present between the divided portions of the electrolyte membrane member that are adjacent to each other, it is possible to accurately detect whether or not the short circuit portion is present in the electrolyte membrane based on the energization state of the limited range including the divided portions around the short circuit portion.

The above and other objects, features and advantages of the present invention will become more apparent from the following description when taken in conjunction with the accompanying drawings in which preferred embodiments of the present invention are shown by way of illustrative example.

DESCRIPTION OF THE PREFERRED EMBODIMENTS

Hereinafter, a preferred embodiment of a method of inspecting short circuit of an electrolyte membrane and an apparatus for inspecting short circuit of the electrolyte membrane according to the present invention will be described with reference to the accompanying drawings.

Figure 1:
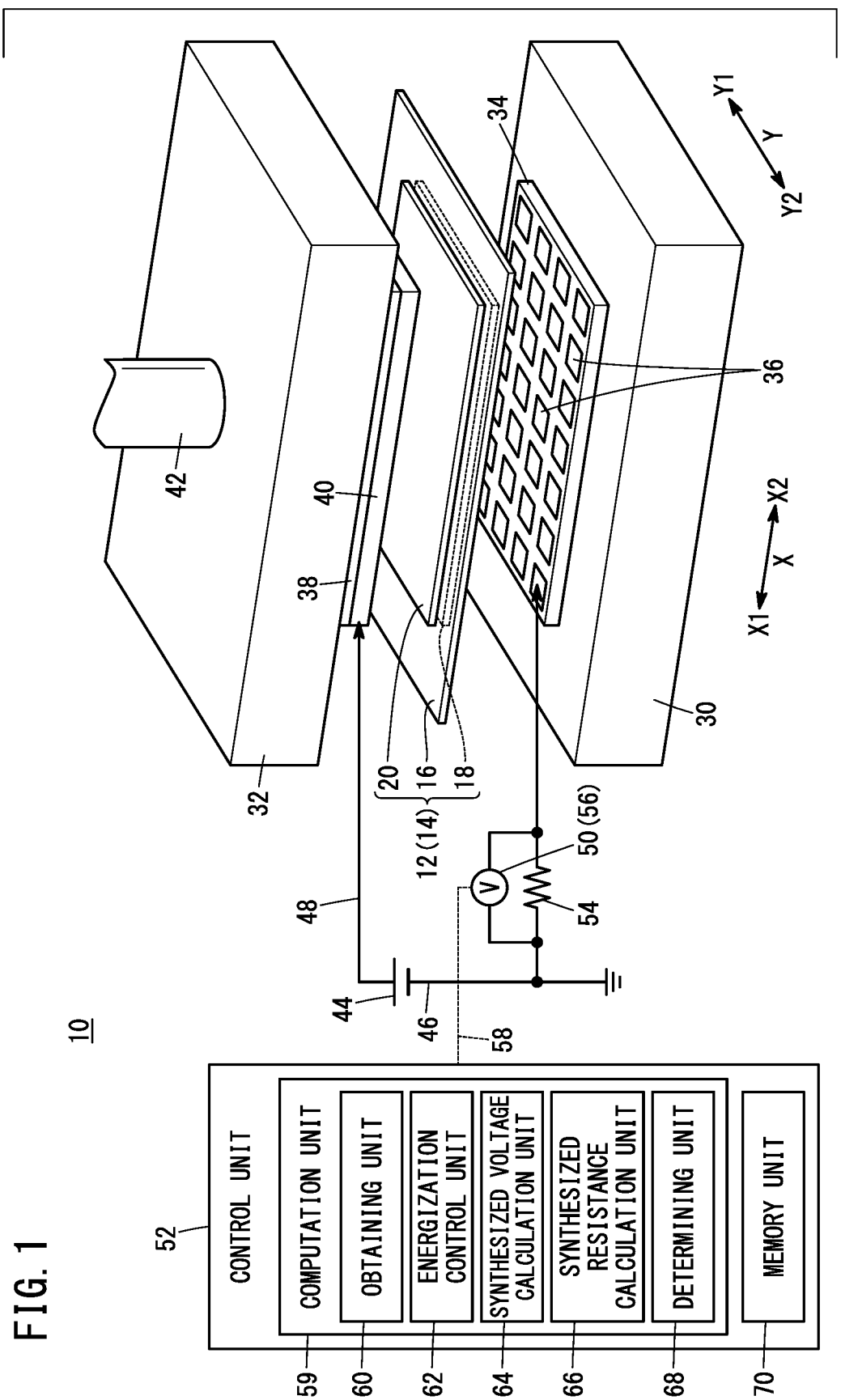
FIG. 1 is a perspective view schematically showing main components of a short circuit inspection apparatus for inspecting short circuit of an electrolyte membrane according to an embodiment of the present invention.
Figure 2:
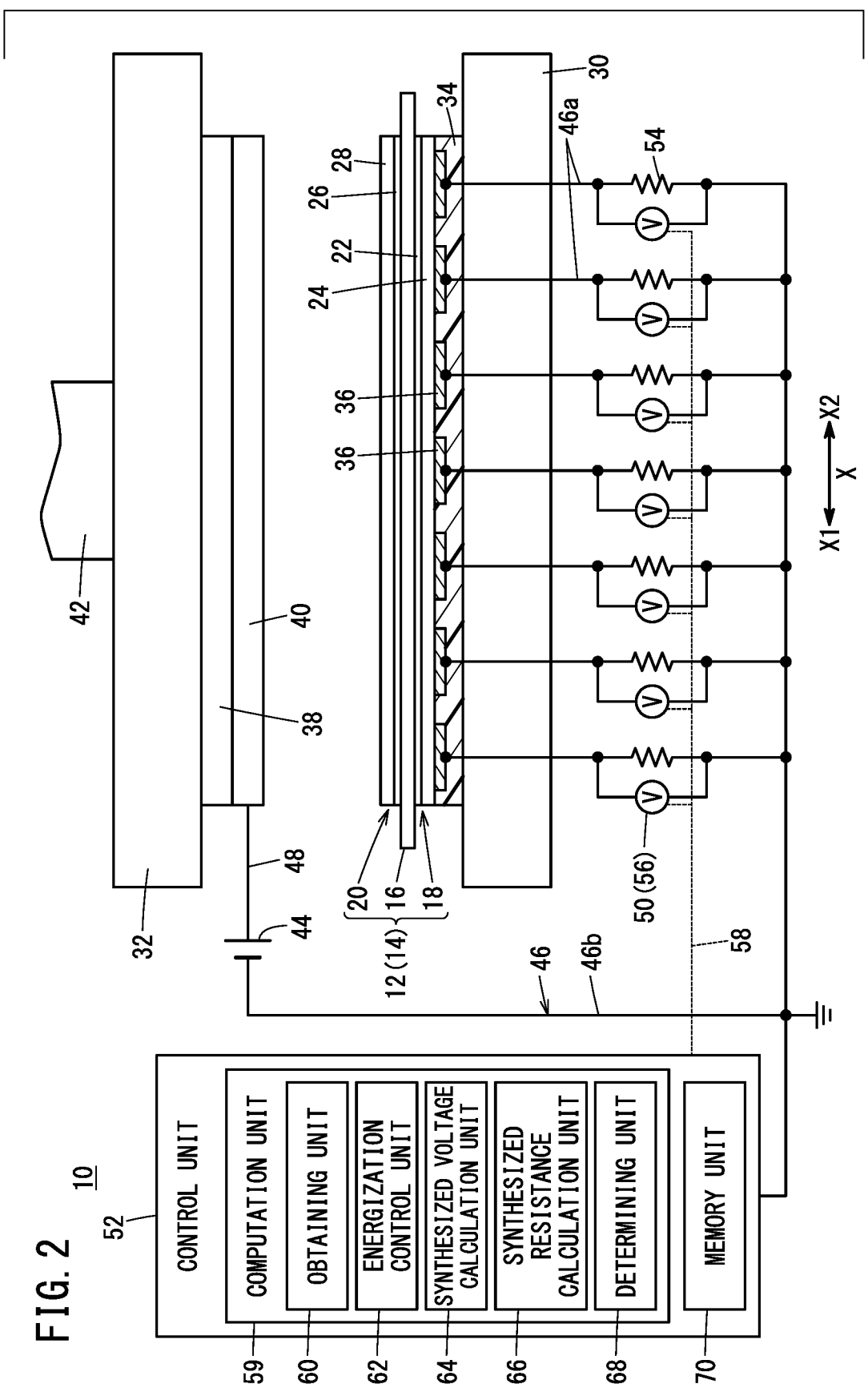
FIG. 2 is a structural view partially in cross section, schematically showing main components of the short circuit inspection apparatus in FIG. 1.

As shown in FIGS. 1 and 2, a short circuit inspection apparatus 10 for inspecting short circuit of an electrolyte membrane 16 according to an embodiment of the present invention (hereinafter simply referred to as the "short circuit inspection apparatus 10") is used for inspecting whether or not there is any short circuit portion S (see FIG. 7A, etc.) in the electrolyte membrane 16 by energizing (applying voltage to cause electrical current to flow) the electrolyte membrane member 12. The short circuit portion S herein means a pinhole, etc. through which abnormal electrical current flows (which may affect the product quality). Stated otherwise, the short circuit inspection apparatus 10 is used for evaluating the membrane thickness of the electrolyte membrane 16.

Firstly, the electrolyte membrane member 12 will be described. In the embodiment of the present invention, the electrolyte membrane member 12 is a membrane electrode assembly (MEA 14) forming a power generation cell (fuel cell). The electrolyte membrane member 12 has a rectangular shape (quadrangular shape). The electrolyte membrane member 12 includes an electrolyte membrane 16, a first electrode 18 provided on one surface of the electrolyte membrane 16, and a second electrode 20 provided on the other surface of the electrolyte membrane 16.

The electrolyte membrane 16 is a solid polymer electrolyte membrane (cation ion exchange membrane). The electrolyte membrane 16 comprises solid polymer having proton conductivity. Preferable examples of solid polymer of this type include perfluorosulfonic acid. However, the present invention is not limited in this respect. Further, for example, the electrolyte membrane 16 is obtained by forming a membrane using polymer solution having ion conductivity as raw material.

The first electrode 18 is one of an anode and a cathode. The second electrode 20 is the other of the anode and the cathode. In FIG. 2, the first electrode 18 includes a first electrode catalyst layer 22 joined to one surface of the electrolyte membrane 16, and a first gas diffusion layer 24 stacked on the first electrode catalyst layer 22. The second electrode 20 includes a second electrode catalyst layer 26 joined to the other surface of the electrolyte membrane 16, and a second gas diffusion layer 28 stacked on the second electrode catalyst layer 26.

The first electrode catalyst layer 22 is formed by depositing porous carbon particles uniformly on the surface of the first gas diffusion layer 24 together with ion conductive polymer binder, and platinum alloy is supported on surfaces of the carbon particles. The second electrode catalyst layer 26 is formed by depositing porous carbon particles uniformly on the surface of the second gas diffusion layer 28 together with ion conductive polymer binder, and platinum alloy is supported on surfaces of the carbon particles. Each of the first gas diffusion layer 24 and the second gas diffusion layer 28 comprises a carbon paper, a carbon cloth, or the like.

As shown in FIGS. 1 and 2, each of the electrolyte membrane 16, the first electrode 18, and the second electrode 20 has a rectangular (quadrangular) shape. The surface size of the electrolyte membrane 16 is slightly larger than the surface size of the first electrode 18 (first electrode catalyst layer 22) and the second electrode 20 (second electrode catalyst layer 26). That is, the portion of the electrolyte membrane 16 protruding outward from the first electrode 18 and the second electrode 20 extends in a frame shape (rectangular annular shape). The surface size of the first electrode 18 and the surface size of the second electrode 20 are the same. It should be noted that the shapes and the sizes of the electrolyte membrane 16, the first electrode 18, and the second electrode 20 can be determined as necessary.

The electrolyte membrane member 12 may be a catalyst coated membrane (CCM) instead of the MEA 14. The CCM comprises the electrolyte membrane 16, the first electrode catalyst layer 22, and the second electrode catalyst layer 26. That is, the CCM does not include the first gas diffusion layer 24 and the second gas diffusion layer 28.

Next, the short circuit inspection apparatus 10 will be described. As shown in FIGS. 1 and 2, the short circuit inspection apparatus 10 includes a lower unit holder 30 and an upper unit holder 32. The lower unit holder 30 is fixed like a fixed die. The upper unit holder 32 is movable like a movable die which can be elevated and lowered in a manner that the upper unit holder 32 can move closer to, and away from the lower unit holder 30.

A plurality of first measurement terminal units 36 are provided on a surface (upper surface) of the lower unit holder 30 oriented toward the upper unit holder 32 through a first insulating membrane 34. The first insulating membrane 34 has a rectangular shape. A plurality of first measurement terminal units 36 are arranged in the long side direction (direction indicated by an arrow X) of the first insulating membrane 34 and in the short side direction (direction indicated by an arrow Y) of the first insulating membrane 34 (see FIG. 5). Stated otherwise, the plurality of first measurement terminal units 36 are arranged in a matrix pattern in the direction indicated by the arrow X and in the direction indicated by the arrow Y.

The adjacent first measurement terminal units 36 are spaced from each other. Stated otherwise, the first insulating membrane 34 is interposed between the adjacent first measurement terminal units 36. Therefore, the plurality of first measurement terminal units 36 are electrically insulated from each other. In the state where the surfaces of the plurality of first measurement terminal units 36 are exposed in a manner that the first measurement terminal units 36 can directly contact the first electrode 18, the first measurement terminal units 36 are embedded in the first insulating membrane 34 (see FIG. 2). Each of the first measurement terminal units 36 is electrically connected to the first electrode 18. Each of the first measurement terminal units 36 is a metal plate having a quadrangular shape. The shape of each of the first terminal units 36 is not limited to the quadrangular shape. Each of the first terminal units 36 may have a circular shape or polygonal shape (other than the quadrangular shape).

A second measurement terminal unit 40 is provided on a surface of the upper unit holder 32 oriented toward the lower unit holder 30 through the second insulating membrane 38. The second measurement terminal unit 40 is in the form of a continuous single metal plate. The surface size of the second measurement terminal unit 40 has the same size as the surface size of the second electrode 20. It should be noted that the surface size of the second measurement terminal unit 40 may be larger than, or smaller than the surface size of the second electrode 20. The upper unit holder 32 is provided for an elevation mechanism (not shown) (e.g., cylinder) through a rod 42, and elevated or lowered under operation of the elevation mechanism. The upper unit holder 32 may be provided with a plurality of guide rods which guides upward movement/downward movement.

The short circuit inspection apparatus 10 includes a power supply 44, a first lead wire 46 electrically connecting the negative terminal of the power supply 44 and each of the first measurement terminal units 36, a second lead wire 48 electrically connecting the positive terminal of the power supply 44 and the second measurement terminal unit 40, a measurement unit 50 provided for the first lead wire 46, and a control unit 52

The power supply 44 is a direct current power supply. In FIG. 2, the first lead wire 46 includes a plurality of branch lead wires 46a electrically connected to the first measurement terminal units 36, respectively, and a connection lead wire 46b electrically connecting these branch lead wires 46a and the negative terminal of the power supply 44 together. Each of the branch lead wires 46a is provided with a resistor 54. The connection lead wire 46b is connected to the earth.

Figure 5:
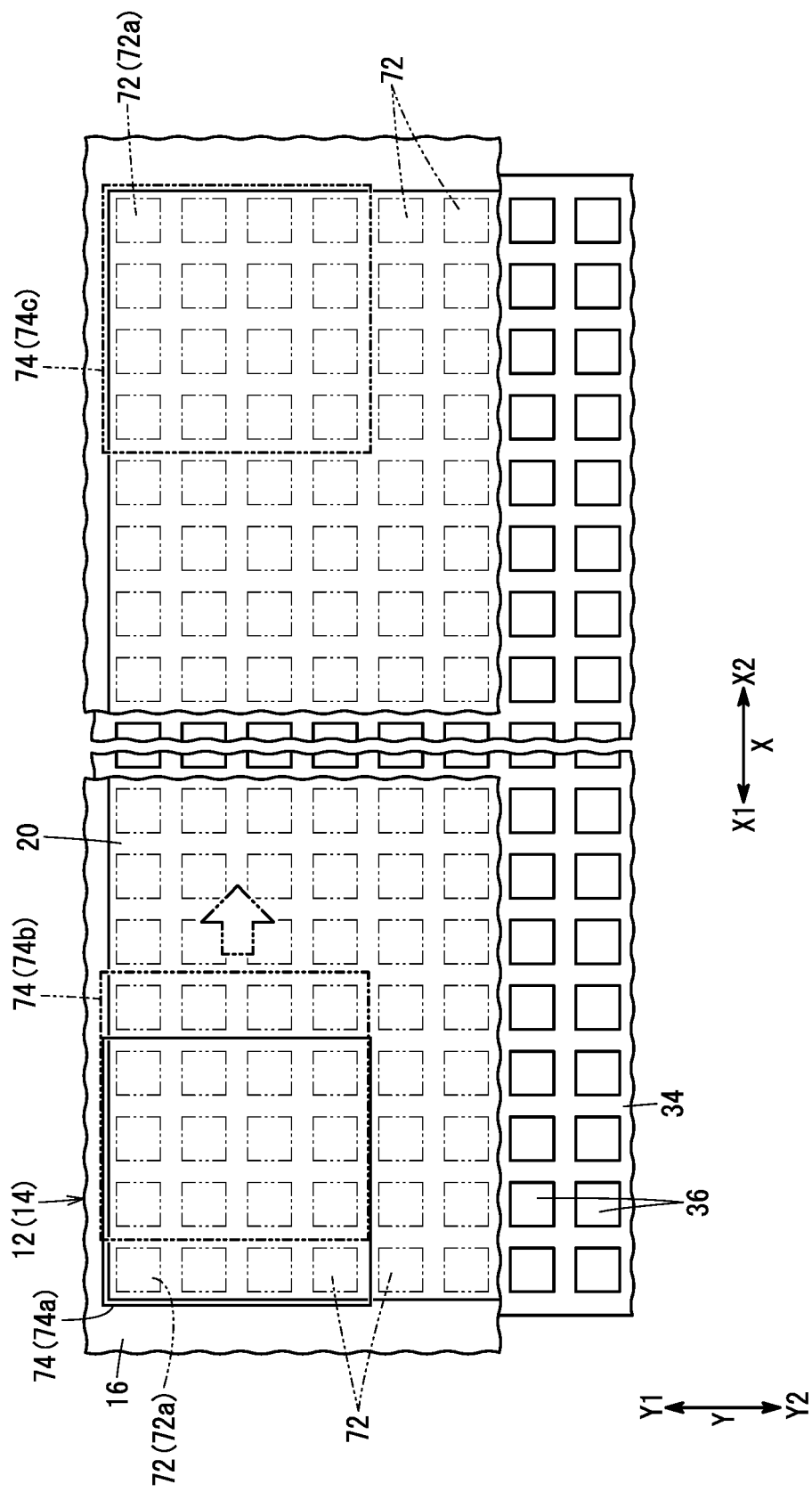
FIG. 5 is a first view illustrating an identifying step.

The measurement unit 50 measures the energization state of a plurality of divided portions 72 formed by dividing the electrolyte membrane member 12 in the surface direction (portions of the electrolyte membrane member 12 facing the plurality of first measurement terminal units 36) (see FIG. 5). Specifically, the measurement unit 50 measures the voltage of each of the divided portions 72 of the electrolyte membrane member 12. Stated otherwise, the measurement unit 50 has a plurality of voltmeters 56 provided for the branch lead wires 46a, respectively. Each of the voltmeters 56 is provided for the branch lead wires 46a, in parallel with the resistor 54. The output signal from each of the voltmeters 56 is inputted to the control unit 52 through a cable 58.

The measurement unit 50 is not limited to an example where the voltage is measured. The measurement unit 50 may measure the electrical current flowing through each of the divided portions 72 of the electrolyte membrane member 12 (electrical current flowing through the first measurement terminal unit 36), and may measure the resistance of each of the divided portions 72 of the electrolyte membrane member 12.

The control unit 52 include a computation unit 59 (processing unit) and a memory unit 70. The computation unit 59 comprise processors such as a CPU (Central Processing Unit) and a GPU (Graphics Processing Unit), i.e., the computation unit comprises a processing circuitry.

The computation unit 59 includes an identification obtaining unit 60 (obtaining unit), an energization control unit 62, a synthesized voltage calculation unit 64, a synthesized resistance calculation unit 66, and a determining unit 68. The identification obtaining unit 60, the energization control unit 62, the synthesized voltage calculation unit 64, the synthesized resistance calculation unit 66, and the determining unit 68 can be realized by executing programs stored in the memory unit 70 by the computation unit 59.

It should be noted that at least some of the identification obtaining unit 60, the energization control unit 62, the synthesized voltage calculation unit 64, the synthesized resistance calculation unit 66, and the determining unit 68 may be realized by an integrated circuit such as an ASIC (Application Specific Integrated Circuit) and an FPGA (Field Programmable Gate Array). Further, it should be noted that at least some of the identification obtaining unit 60, the energization control unit 62, the synthesized voltage calculation unit 64, the synthesized resistance calculation unit 66, and the determining unit 68 may comprise an electronic circuit including discrete devices.

The memory unit 70 may be made up of a volatile memory (not shown), and a non-volatile memory (not shown). Examples of the volatile memory includes a RAM (Random Access Memory), etc. Examples of the non-volatile memory includes a ROM (Read only memory), a flash memory, etc. Data, etc. may be stored in the volatile memory, for example. Programs, tables, maps, etc. may be stored in the non-volatile memory, for example. At least part of the memory unit 70 may be provided in the processor, the integrated circuit, etc. as described above.

The identification unit 60 identifies one of a plurality of limited ranges 74 including the divided portions 72 that are adjacent to each other in a range which is smaller than the entire range of the plurality of divided portions 72 (see FIG. 5). The energization control unit 62 controls ON/OFF of the power supply 44. The synthesized voltage calculation unit 64 calculates a synthesized voltage value of the limited range 74 based on the voltage values measured by a plurality of voltmeters 56. Specifically, the synthesized voltage calculation unit 64 calculates the synthesized voltage value by measuring voltage values of the plurality of divided portions 72 included in the limited range 74 using the plurality of voltmeters 56 and summing the measured voltage values. The synthesized resistance calculation unit 66 calculates a synthesized resistance value based on the synthesized voltage value calculated by the synthesized voltage calculation unit 64. Specifically, the synthesized resistance calculation unit 66 calculates the synthesized resistance value by dividing the synthesized voltage value by the sum of electrical current flowing through the plurality of divided portions 72 included in the limited range 74. The determining unit 68 determines whether or not the short circuit portion S is present in the electrolyte membrane 16 based on the synthesized resistance value.

Next, a method of inspecting short circuit of the electrolyte membrane 16 (hereinafter simply referred to as the "short circuit inspection method") will be described. The short circuit inspection method includes a disposing step, a contacting step, and an energizing step, an obtaining step, and a determining step.

Figure 3:
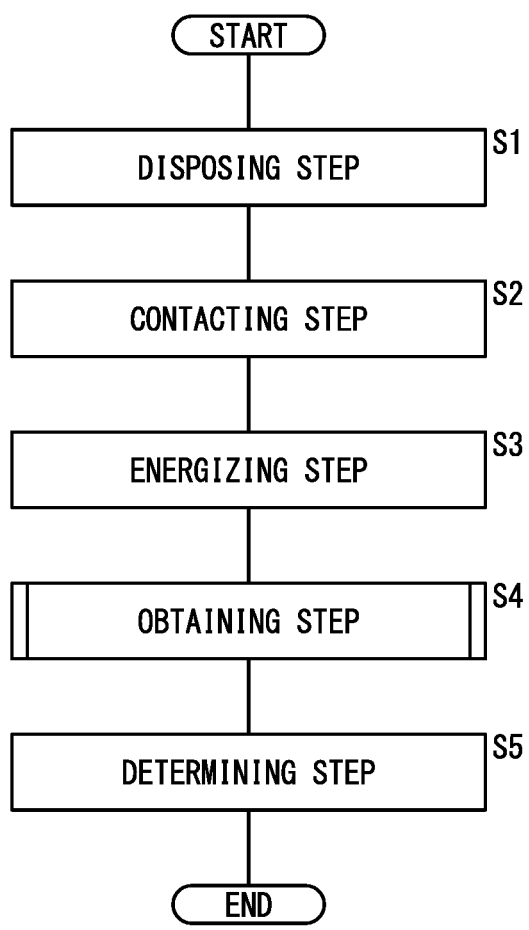
FIG. 3 is a flow chart illustrating a method of inspecting short circuit of the electrolyte membrane according to one embodiment of the present invention.

Firstly, as shown in FIGS. 1 and 2, in the disposing step (step S1 in FIG. 3), an electrolyte membrane member 12 prepared beforehand is disposed on a plurality of first measurement terminal units 36 provided in the lower unit holder 30. At this time, the first electrode 18 of the electrolyte membrane 12 contacts each of the plurality of first measurement terminal units 36. The second electrode 20 of the electrolyte membrane member 12 faces the second measurement terminal unit 40 provided for the upper unit holder 32.

Then, in the contacting step (step S2), a rod 42 is operated to displace the upper unit holder 32 toward the lower unit holder 30 to bring the second electrode 20 into contact with the second measurement terminal unit 40. Thus, the electrolyte membrane member 12 is held between the plurality of first measurement terminal units 36 and the second measurement terminal unit 40. Stated otherwise, the first electrode 18 of the electrolyte membrane member 12 is pressed upward by the plurality of first measurement terminal units 36. Further, the second electrode 20 of the electrolyte membrane member 12 is pressed downward by the second measurement terminal unit 40.

Thereafter, in the energizing step (step S3), the energization control unit 62 starts energization of the electrolyte membrane member 12. That is, supply of the direct current from the power supply 44 causes energization between the first measurement terminal unit 36 and the second measurement terminal unit 40. At this time, since a predetermined gap is formed between the lower unit holder 30 and the upper unit holder 32, the electrical current does not flow through the lower unit holder 30 and the upper unit holder 32.

In this regard, each of the first electrode 18 and the second electrode 20 is an electric conductor, and the electrolyte membrane 16 is a dielectric. In the case where the short circuit portion S is present in the electrolyte membrane 16, the electrical current supplied from the power supply 44 to the second measurement terminal unit 40 flows toward the second electrode 20, the short circuit portion S of the electrolyte membrane 16, and the first measurement terminal units 36. In the energizing step, the voltage values of all of the divided portions 72 are measured by the plurality of voltmeters 56, and the measured voltage values are stored in the memory unit 70. After all of the voltage values are stored in the memory unit 70, the energization control unit 62 turns off the power supply 44.

Then, in the obtaining step (step S4), as shown in FIG. 5, the energization state of the plurality of limited ranges 74 of the electrolyte membrane member 12 is obtained. The limited ranges 74 that are closest to each other are shifted from each other by one divided portion 72, in the surface direction of the electrolyte membrane member 12 (in the direction indicated by the arrow X or in the direction indicated by the arrow Y).

Figure 4:
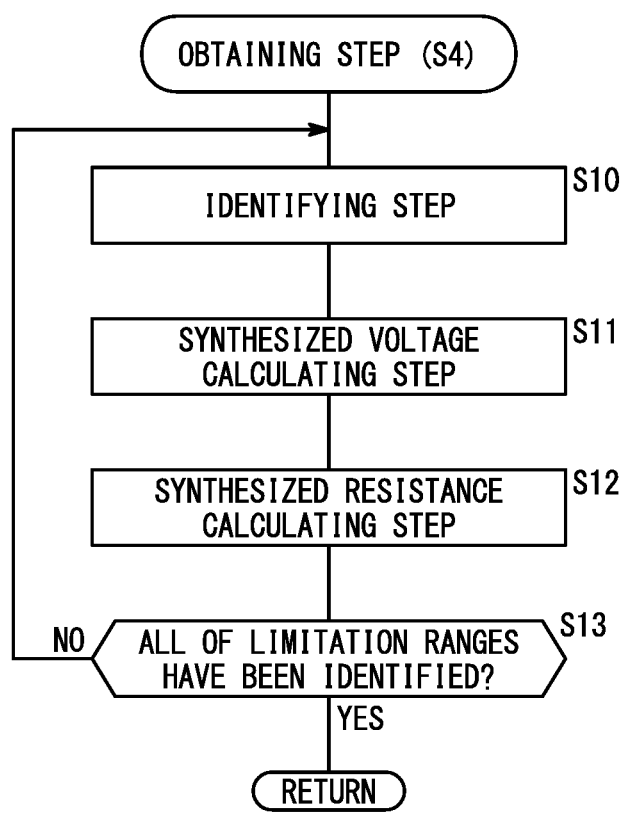
FIG. 4 is a flow chart illustrating an obtaining step in FIG. 3.

Specifically, in the obtaining step, as shown in FIG. 4, the identifying step, the synthesized voltage calculating step, and the synthesized resistance calculating step are repeated a plurality of times.

That is, in the identifying step (step S10), the identification obtaining unit 60 identifies one of the limited ranges 74, and obtains the energization state of the identified limited range 74. The size of the limited range 74 is determined beforehand as described later. In the identifying step, the identification obtaining unit 60 identifies the limited range 74 at a position shifted from the previously identified limited range 74 by one divided portion 72 in the surface direction (direction indicated by the arrow X or the direction indicated by the arrow Y).

Specifically, for example, as shown in FIG. 5, in the first identifying step, in the case where the identification obtaining unit 60 identifies a limited range 74a including the divided portion 72 positioned at a corner (e.g., a corner in the direction indicated by the arrow X1 and in the direction indicated by the arrow Y1) among the plurality of divided portions 72 (hereinafter referred to as the "divided portion 72a"), in the second identifying step, the identification obtaining unit 60 identifies a limited range 74b at a position shifted from the limited range 74a by one divided portion 72 in the direction indicated by the arrow X2. Then, the identification obtaining unit 60 continues the process of identifying the limited range 74 at a position shifted from the previously identified limited range 74 by one divided portion 72 in the direction indicated by the arrow X2, until a limited range 74c including the divided portion 72 provided at the end in the direction indicated by the arrow X2 is identified.

Figure 6:
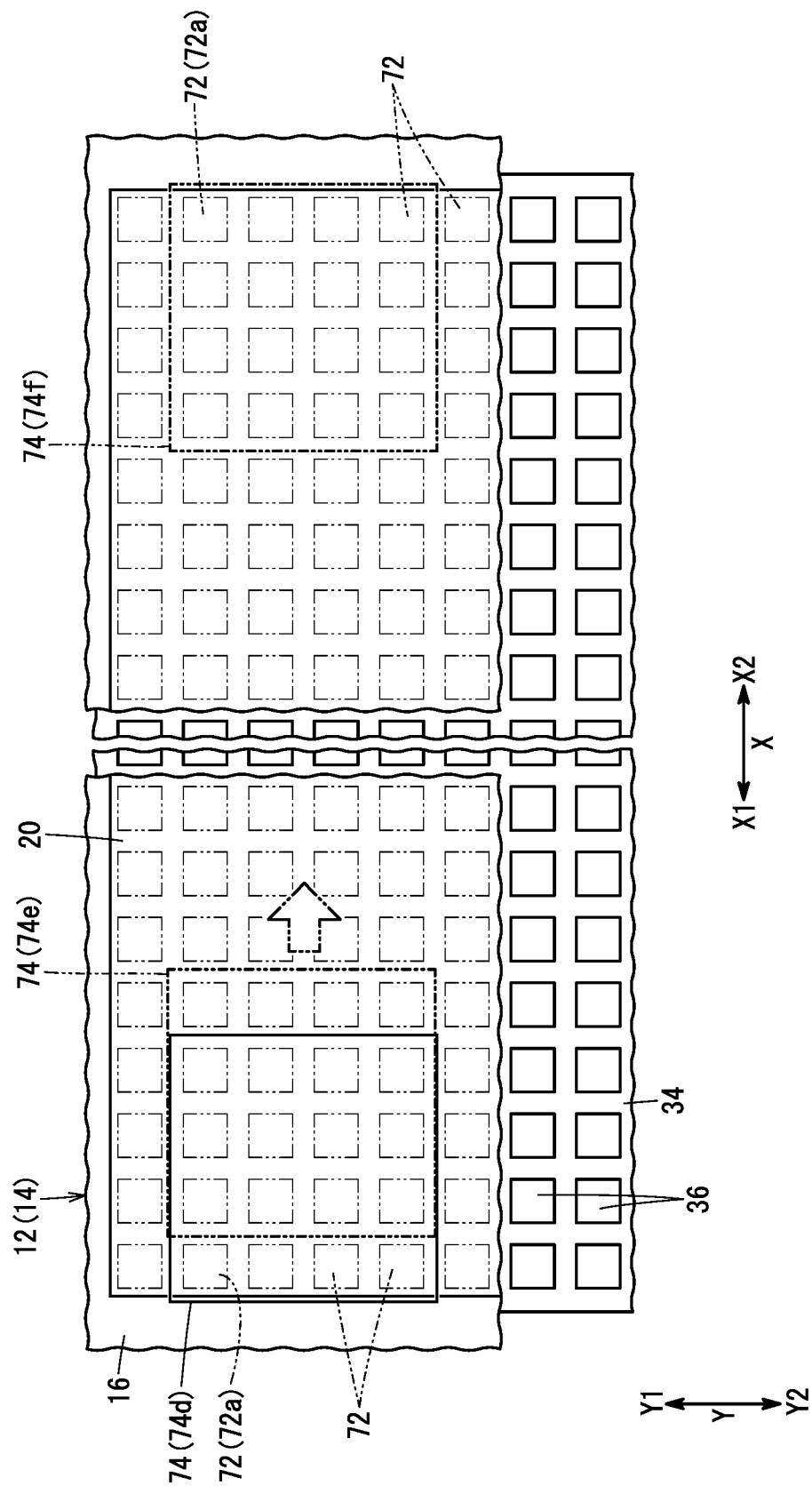
FIG. 6 is a second view illustrating the identifying step.

Then, for example, in FIG. 6, after the identification obtaining unit 60 identifies a limited range 74d at a position shifted from the limited range 74a in FIG. 5 by one divided portion 72 in the direction indicated by the arrow Y2, the identification obtaining unit 60 identifies a limited range 74e at a position shifted from the limited range 74d by one divided portion 72 in the direction indicated by the arrow X2. Then, the identification obtaining unit 60 continues the process of identifying the limited range 74 at a position shifted from the previously identified limited range 74 by one divided portion 72 in the direction indicated by the arrow X2, until a limited range 74f including the divided portion 72 provided at the end in the direction indicated by the arrow X2 is identified. The identifying step is continued until the limited range 74 including the divided portion 72a at the corner in the direction indicated by the arrow X2 and in the direction indicated by the arrow Y2 is identified.

In the identifying step, the order of identifying the limited ranges 74 can be changed as necessary. In the identifying step, for example, after the limited range 74c in FIG. 5 is identified, the limited range 74f at a position shifted from the limited range 74c by one divided portion 72 in the direction indicated by the arrow Y2 may be identified. In this case, the identification obtaining unit 60 continues the process of identifying the limited range 74 at a position shifted from the previously identified limited range 74 by one divided portion 72 in the direction indicated by the arrow X1, until a limited range 74 including the divided portion 72 provided at the end in the direction indicated by the arrow X1 is identified.

Further, in the identifying step, the process of identifying the limited range 74 at a position shifted from the previously identified limited range 74 by one divided portion 72 in the direction indicated by the arrow Y may be performed from one end to the other end in the direction indicated by the arrow Y.

Further, in the identifying step, each time the identification obtaining unit 60 identifies the limited range 74, the identification obtaining unit 60 obtains the voltage values of the respective divided portions 72 including the identified limited range 74 from the memory unit 70.

In the synthesized voltage calculating step (step S11), the synthesized voltage calculation unit 64 calculates the synthesized voltage value of the limited range 74 by synthesizing the voltage values obtained in the identifying step.

In the synthesized resistance calculating step (step S12), the synthesized resistance calculation unit 66 calculates the synthesized resistance value of the limited range 74 based on the synthesized voltage value calculated by the synthesized voltage calculation unit 64. The calculated synthesized resistance value is stored in the memory unit 70.

Thereafter, the control unit 52 determines whether or not the synthesized resistance value has been calculated in all of the limited ranges 74 (whether or not all of the limited ranges 74 have been identified) (step S13). In the case where the control unit 52 determines that the synthesized resistance value has not been calculated in all of the limited ranges 74 (step S13: NO), the identifying step, the synthesized voltage calculating step, and the synthesize resistance calculating step are performed again. In the case where the control unit 52 determines that the synthesized resistance value is calculated in all of the limited ranges 74 (step S13: YES), the determining step (step S5 in FIG. 3) is performed.

In the identifying step, the identification unit 68 identifies whether or not the short circuit portion S (see FIG. 7A) is present in the electrolyte membrane 16 based on the energization state of the plurality of limited ranges 74 obtained in the obtaining step. Specifically, in the case where the lowest synthesized resistance value among the synthesized resistance values of the plurality of limited ranges 74 is lower than a resistance threshold value R0 (see FIG. 12), the determining unit 68 determines that the short circuit portion S is present in the limited range 74 having the lowest synthesized resistance value. At this time, the determining unit 68 determines that the short circuit portion S is present adjacent to the center of the limited range 74 including the lowest synthesized resistance value. Further, in the case where the lowest synthesized resistance value among the synthesized resistance values of the plurality of limited ranges 74 is not less than the resistance threshold value R0, the determining unit 68 determines that there is no short circuit portion S in the entire electrolyte membrane 16.

Figure 7A:
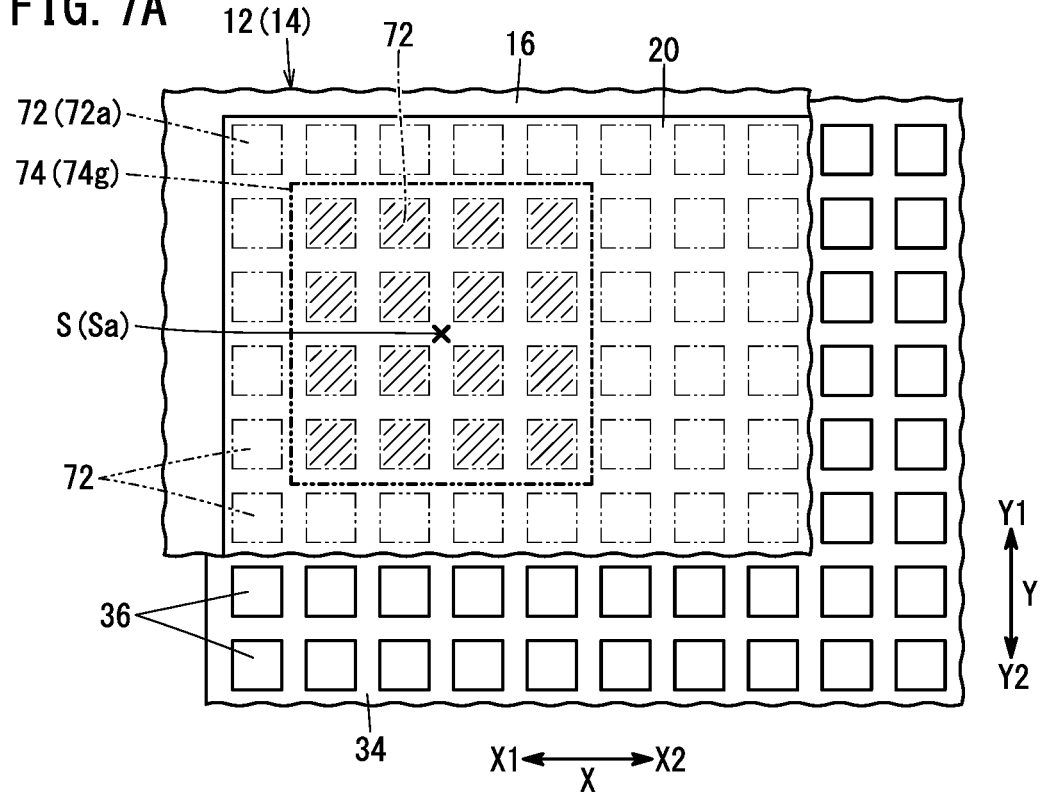
FIG. 7A is a first view illustrating a determining step.

As shown in FIG. 7A, for example, it is assumed that only one short circuit portion S (hereinafter also referred to as the "short circuit portion Sa") is present between the divided portions 72 of the electrolyte membrane 16 that are adjacent to each other. In this case, the current supplied from the power supply 44 to the second measurement terminal unit 40 flows through the short circuit portion Sa to the plurality of first measurement terminal units 36 positioned around the short circuit portion Sa through the short circuit portion Sa (e.g., the first measurement terminal units 36 positioned in a hatched area in FIG. 7A). In this regard, a larger electrical current flows through the first measurement terminal 36 which is closer to the short circuit portion Sa.

Figure 7B:
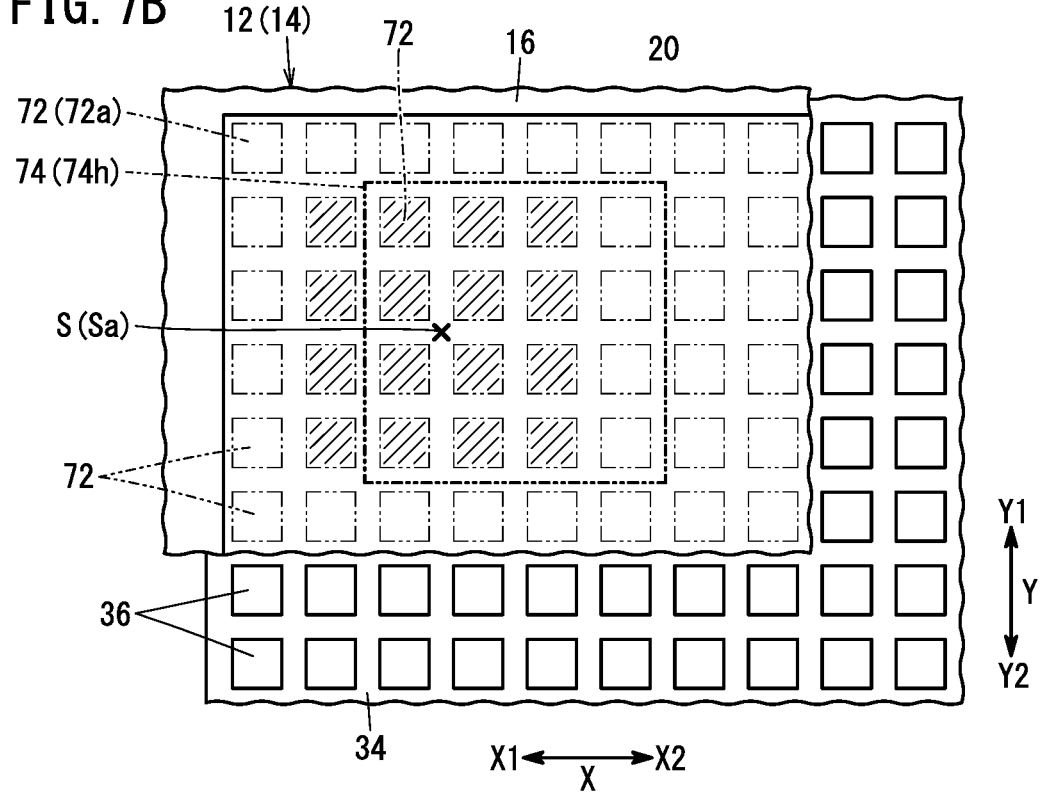
FIG. 7B is a second view illustrating the determining step.

In this system, the synthesized resistance value of the limited range 74g shown in FIG. 7A is lower than the synthesized resistance value of the limited range 74 at a position shifted from the limited range 74g by one divided portion 72 (e.g., a limited range 74h shown in FIG. 7B).

That is, the limited range 74g has the lowest resistance value among the plurality of limited ranges 74. Therefore, the determining unit 68 determines that the short circuit portion SA is present near the center of the limited range 74g.

Figure 8A:
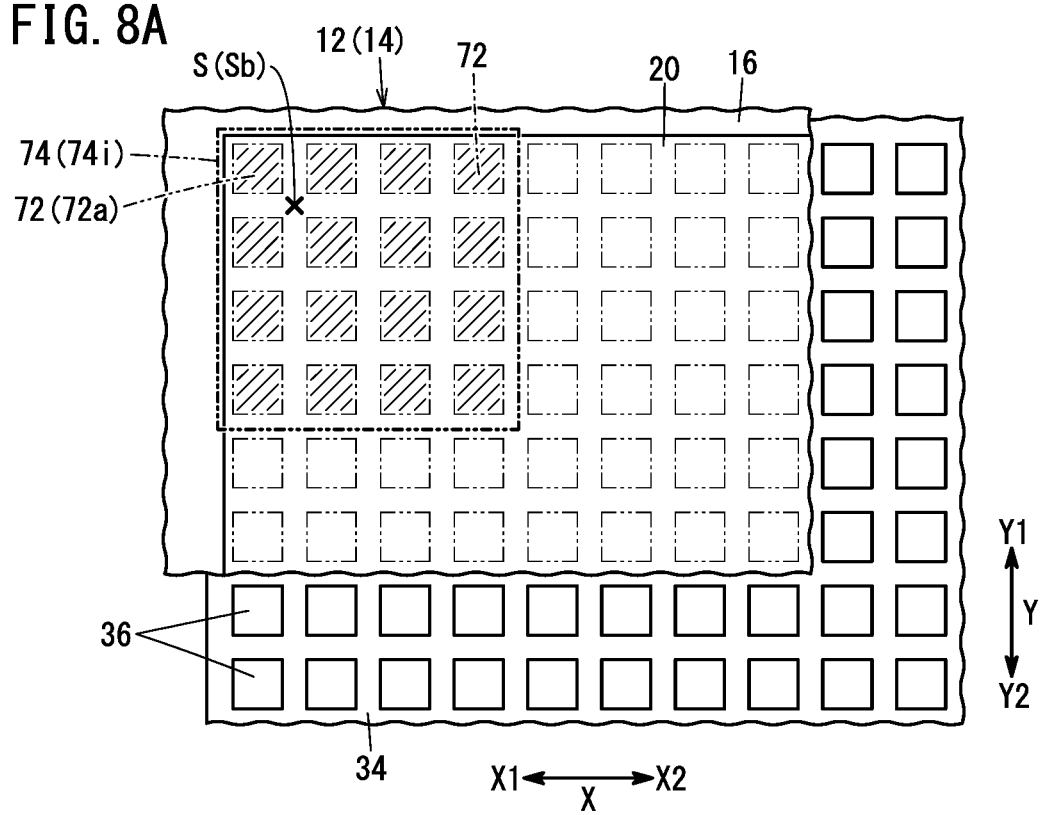
FIG. 8A is a third view illustrating the determining step.

Further, as shown in FIG. 8A, for example, it is assumed that only one short circuit portion S is present between the divided portion 72a positioned at the corner of the electrolyte membrane 16 and the divided portion 72 adjacent to the divided portion 72a (hereinafter also referred to as "short circuit portion Sb"). In this case, the electrical current supplied from the power supply 44 to the second measurement terminal unit 40 spreads inward from the short circuit portion Sb (in the directions indicated by the arrow X2 and in the direction indicated by the arrow Y2) (for example, in FIG. 8A, the electrical current flows through the first measurement terminal unit 36 positioned in a hatched area shown in FIG. 8A).

Figure 8B:
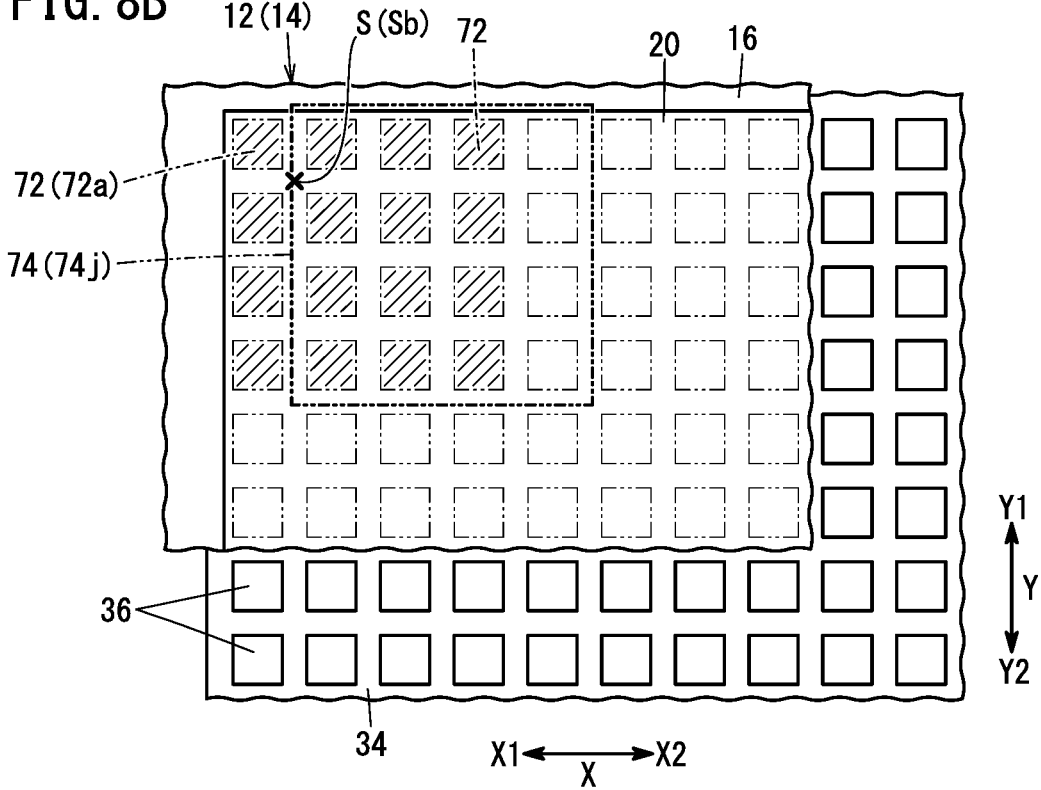
FIG. 8B is a fourth view illustrating the determining step.

As a result, the synthesized resistance value of the limited range 74i shown in FIG. 8A becomes lower than the synthesized resistance value of the limited range 74 at a position shifted from the limited range 74i by one divided portion 72 (e.g., a limited range 74j shown in FIG. 8B). That is, the limited range 74i has the lowest synthesized resistance value among the plurality of limited ranges 74. In such a case, the determining unit 68 determines that the short circuit portion Sb is present at a position closer to the divided portion 72a from the center of the limited range 74.

In the determining step, in the case where it is determined that the short circuit portion S is present in the electrolyte membrane 16, the electrolyte membrane member 12 including the electrolyte membrane 16 is discarded. In the determining step, in the case where it is determined that there is no short circuit portion S in the electrolyte membrane 16, the electrolyte membrane member 12 including the electrolyte membrane 16 is used for producing the fuel cell. After the determining step, a series of operation flow is finished.

Figure 9:
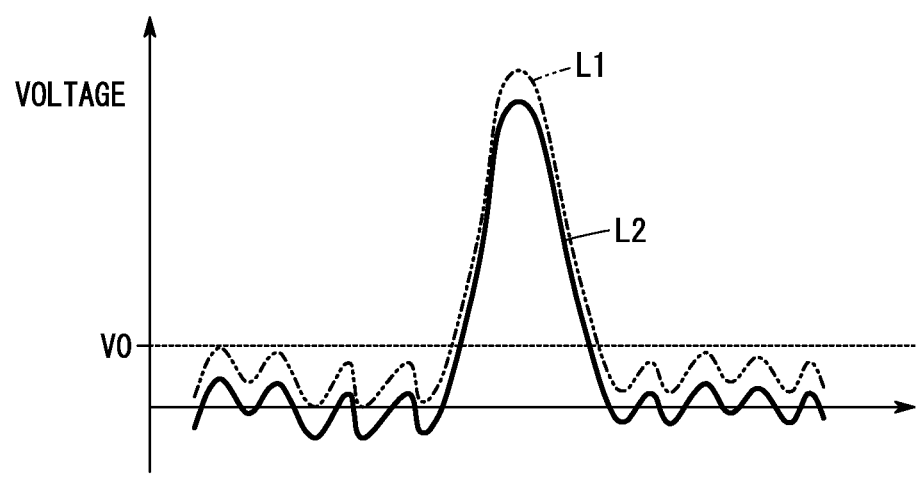
FIG. 9 is a graph showing the measurement voltage before noises are removed, and the voltage after the noises are removed from the measurement voltage.

Next, the setting of the size of the limited range 74 described above will be described. In the case of setting the size of the limited range 74, the electrolyte membrane member 12 having the short circuit portion S identified beforehand is prepared. Further, the short circuit inspection apparatus 10 is used to energize the electrolyte membrane member 12, and the voltage value of the divided portion 72 around the short circuit portion S is measured by the voltmeter 56. As a result, the voltage value (measurement voltage value) measured by the voltmeter 56 is shown by a virtual line L1 in FIG. 9. Minute electrical current flows through the portion in the electrolyte membrane 16 where the short circuit portion S is not present due to water, etc. contained in the electrolyte membrane 16. Thus, as shown in FIG. 9, the measurement voltage includes the noise voltage in correspondence with the amount of water content, etc. in the electrolyte membrane 16.

Then, the average value of voltages among the measurement voltage values which are lower than the background voltage threshold value V0 is calculated as the background voltage (noise voltage), and the voltage value (correction voltage value) obtained by subtracting the background voltage from the voltage value of each of the plurality of divided portions 72 is calculated. The correction voltage value is shown by a solid line L2 in FIG. 9.

Thereafter, while increasing the number of synthesized correction voltage values (voltage values denoted by the solid line L2 in FIG. 9), the synthesized voltage value is calculated, and the synthesized range when the amount of change of the synthesized voltage value becomes not more than a predetermined value (range of the plurality of divided portions 72) is used as the limited range 74. In this regard, the predetermined value is set to a value where the synthesized voltage value does not change significantly even if the number of synthesized correction voltage values is increased further.

Figure 10:
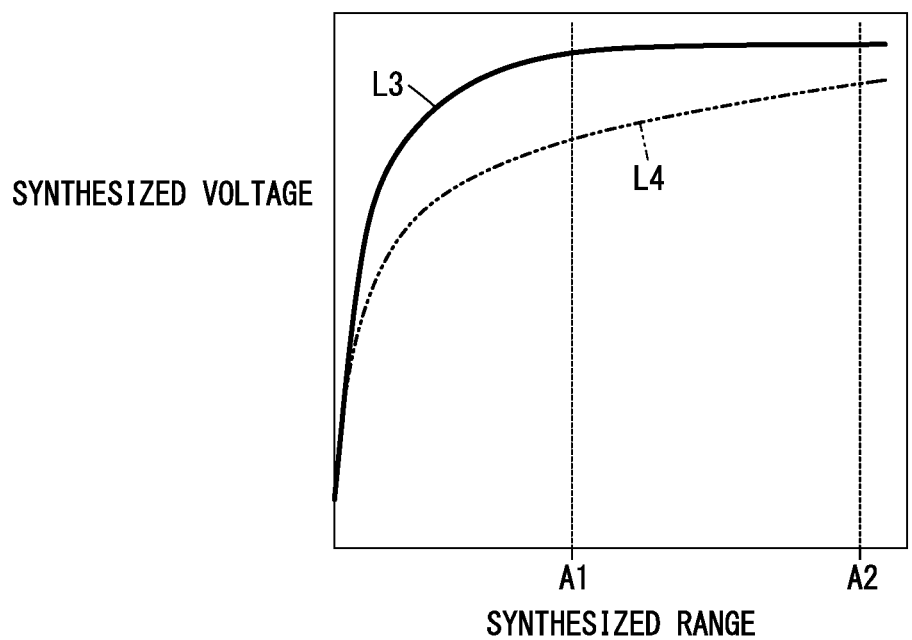
FIG. 10 is a graph showing the relationship between the size of a synthesized range and synthesized voltage.

FIG. 10 is a graph showing the relationship between the size of the synthesized range (number of synthesized voltage values) and the synthesized voltage value. The synthesized voltage value calculated based on the correction voltage value is shown by a solid line L3 in FIG. 10. In this case, the size of the limited range 74 (the number of divided portions 72 included in the limited range 74) is a synthesized range A1.

On the other hand, the synthesized voltage value calculated based on the measurement voltage value (voltage value before noises are removed) is shown by a virtual line L4 in FIG. 10. In this case, the size of the limited range 74 (the number of divided portions 72 included in the limited range 74) is a synthesized range A2. The synthesized range A1 is smaller than the synthesized range A2. By setting the size of the limited range 74 based on the correction voltage value in this manner, it is possible to make the limited range 74 having a suitable size.

In the case where the synthesized range is too small, the limited range 74 (synthesized range) is set immediately before the synthesized voltage value becomes constant. In this case, since the manner in which the synthesized voltage value rises changes depending on the short circuit portion S, there is a concern that variation in the measurement may occur. Further, if the synthesized range is too wide, in the case where a plurality of short circuit portions S are present in one limited range 74, the voltage values of the short circuit portions S are synthesized, and there is a concern that erroneous detection may occur.

The short circuit inspection method of inspecting short circuit of the electrolyte membrane 16, and the short circuit inspection apparatus 10 for inspecting short circuit of the electrolyte membrane 16 according to the embodiment offer the following advantages.

The short circuit inspection method includes an energizing step of energizing the plurality of divided portions 72 formed by dividing the electrolyte membrane member 12 in a surface direction, through the first measurement terminal unit 36 and the second measurement terminal unit 40, an obtaining step of performing a process of obtaining the energization state of the limited range 74 including divided portions 72 that are adjacent to each other in a range which is smaller than the entire range of the plurality of divided portions 72, for each of the plurality of limited ranges 74 provided at different positions, and a determining step of determining whether or not the short circuit portion S is present in the electrolyte membrane 16 based on the energization state of the plurality of limited ranges 74 obtained in the obtaining step.

In this method, the energization state of the limited range 74 including the divided portions 72 that are adjacent to each other in a range which is smaller than the entire range of the plurality of divided portions 72 of the electrolyte membrane member 12 is obtained. Therefore, even if the short circuit portion S is present between the divided portions 72 of the electrolyte member 12 that are adjacent to each other, it is possible to accurately determine whether or not the short circuit portion S is present in the electrolyte membrane 16 based on the energization state of the limited range 74 including the divided portions 72 around the short circuit portion S.

The limited ranges 74 that are closest to each other, among the plurality of limited ranges 74 are shifted from each other by one of the plurality of divided portions 72.

In this case, it is possible to detect whether or not the short circuit portion S is present in the electrolyte membrane 16 more accurately.

In the obtaining step, one of the plurality of limited ranges 74 is identified, and the energization state of the identified limited range 74 is obtained a plurality of times. In the identifying step, the limited range 74 at a position shifted from the previously identified limited range 74 by one of the plurality of divided portions 72 in the surface direction is identified.

In this method, it is possible to efficiently obtain the energization state of the plurality of limited ranges 74.

In the obtaining step, the voltage value of each of the plurality of divided portions 72 included in the limited range 74 identified in the identifying step is obtained. The obtaining step includes a synthesized voltage calculating step of calculating a synthesized voltage value obtained by synthesizing voltage values of the plurality of divided portions 72 included in the plurality of limited ranges 74, respectively. In the determining step, it is determined whether or not the short circuit portion S is present in the electrolyte membrane 16 based on the synthesized voltage value.

In this method, it is possible to accurately measure the energization state of the limited range 74.

The obtaining step includes a synthesized resistance calculating step of calculating a synthesized resistance value of each of the plurality of limited ranges 74 based on the synthesized voltage value. In the determining step, in the case where the synthesized resistance value which is the lowest among the synthesized resistance values of the plurality of limited ranges 74 is lower than a resistance threshold value R0, it is determined that the short circuit portion S is present adjacent to the center of the limited range 74 having the lowest synthesized resistance value.

In this method, even if the short circuit portion S is present between the divided portions 72 that are adjacent to each other, it is possible to detect the short circuit portion S accurately.

The obtaining step includes a synthesized resistance calculating step of calculating a synthesized resistance value of each of the plurality of limited ranges 74 based on the synthesized voltage value. In the determining step, it is determined that the short circuit portion S is present in the limited range 74 having a synthesized resistance value which is lower than a resistance threshold value R0.

In this method, even if a plurality of short circuit portions S are present in the electrolyte membrane 16, it is possible to detect the short circuit portions S accurately.

At the time of energizing the electrolyte membrane member 12 through the first measurement terminal unit 36 and the second measurement terminal unit 40, an average value of voltage values of the plurality of divided portions 72 which are not more than a background voltage threshold value V0 is calculated as a background voltage, and the size of the limited range 74 is determined based on a correction voltage value obtained by subtracting the background voltage from each of the voltage values of the plurality of divided portions 72.

In this case, at the time of determining the short circuit portion S, the range of the limited range 74 (synthesized range) can be set after removing the voltage which is regarded as noises, it is possible to improve the measurement accuracy of the short circuit portion S.

At the time of measuring voltage values of the plurality of divided portions 72 positioned around a short circuit portion S which is identified beforehand and calculating a synthesized voltage value while increasing the number of synthesized voltage values, the size of the limited range 74 is set in the ranges of the plurality of divided portions 72 when the amount of change of the synthesized voltage value becomes not more than a predetermined value.

In this case, since the range of limited range 74 which is effective for determining the short circuit portion S (synthesized range) is set, it is possible to improve the measurement accuracy of measuring the short circuit portion S to a greater extent.

The short circuit inspection apparatus 10 includes the first measurement terminal unit 36 and the second measurement terminal unit 40 configured to hold the electrolyte membrane member 12, the power supply 44 configured to cause energization between the first measurement terminal unit 36 and the second measurement terminal unit 40, the identification obtaining unit 60 configured to obtain the energization state of the electrolyte membrane member 12, and the determining unit 68 configured to determine whether or not the short circuit portion S is present in the electrolyte membrane 16 based on the energization state obtained by the identification obtaining unit 60. The plurality of the first measurement terminal units 36 are disposed in a state where the first measurement terminal units 36 are insulated from each other. The identification obtaining unit 60 is configured to measure the energization state of a limited range 74 including divided portions 72 that are adjacent to each other in a range which is smaller than the entire range of a plurality of divided portions 72 of the electrolyte membrane member 12 facing the plurality of first measurement terminal units 36.

In the structure, the energization state of the limited range 74 including the divided portions 72 that are adjacent to each other in a range which is smaller than the entire range of the plurality of divided portions 72 of the electrolyte membrane member 12 is obtained. Therefore, even in the case where the short circuit portion S is present between the divided portion 72 of the electrolyte membrane member 12 that are adjacent to each other, it is possible to accurately detect whether or not the short circuit portion S is present in the electrolyte membrane 16 based on the energization state of the plurality of the limited ranges 74 including the divided portions 72 around the short circuit portion S.

The present invention is not limited to the above described embodiment. Various modifications can be made without departing from the gist of the present invention.

The electrolyte membrane member 12 may be transported by a roll to roll system. In this case, it is required to cut the short circuit portion S of the electrolyte membrane 16 by trimming. That is, as shown in FIG. 11, in the case where a plurality of short circuit portions S are present in the electrolyte membrane 16, these circuit portions S are cut away after the short circuit inspection.

Figure 11:
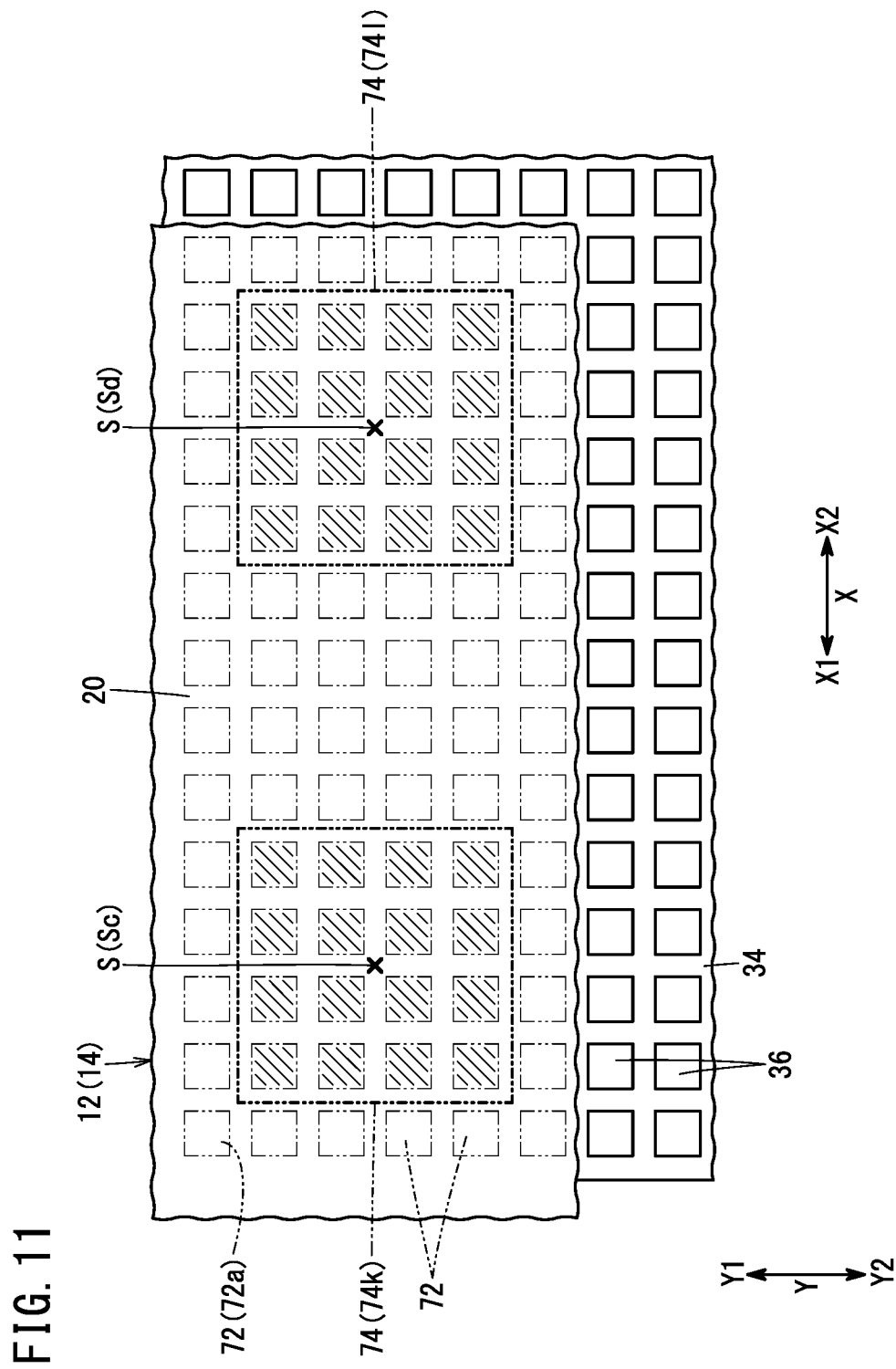
FIG. 11 is a view illustrating a determining step according to a modified embodiment.

As shown in FIG. 11, in the electrolyte membrane member 12 as described above, it is assumed that a plurality of short circuit portions S (a short circuit portion Sc and a short circuit portion Sd) are present between the divided portions 72 of the electrolyte membrane member 12 that are adjacent to each other. As a result, in the area around the short circuit Sc, the synthesized resistance value in the limited range 74$k$ becomes the lowest, and the synthesized resistance value of the limited range 74$l$ becomes the lowest in the area around the short circuit portion Sd.

Figure 12:
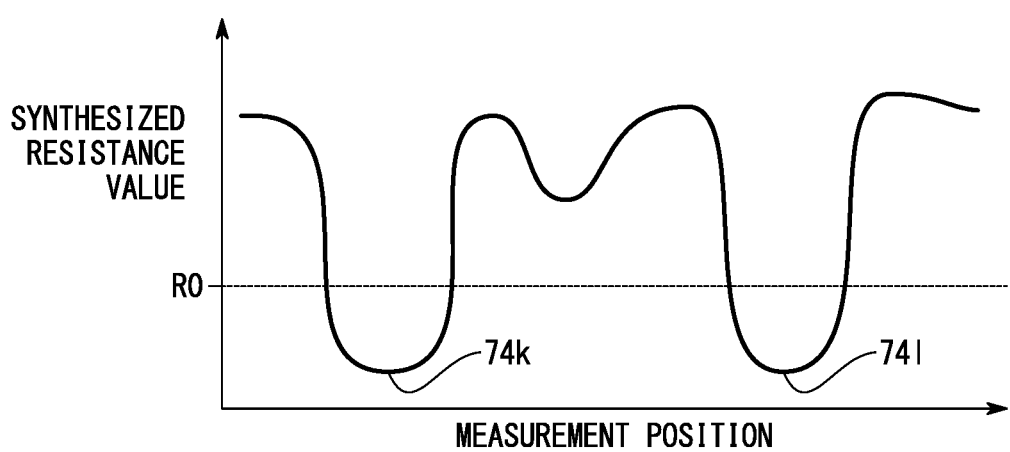
FIG. 12 is a graph showing the relationship between a measurement position and a synthesized resistance value.

In this case, as shown in FIG. 12, in the determining step, the determining unit 68 determines whether or not the synthesized resistance value of each of the limited ranges 74$k$ 74$l$ is lower than the resistance threshold value R0, and determines that the short circuit portions Sc, Sd are present in the plurality of limited ranges 74$k$, 74$l$, having the synthesized resistance value which is lower than the resistance threshold value R0, respectively. At this time, the determining unit 68 determines that the short circuit portions Sc, Sd are preset adjacent to the center of the limited ranges 74$k$, 74$l$ having the lowest synthesized resistance value, in the limited range 74 positioned between the limited ranges 74 (limited ranges 74 positioned at the border) having the synthesized resistance value closest to the resistance threshold value R0, among the plurality of limited ranges 74 where it is determined that the short circuit portions Sc, Sd are present. Further, the determining unit 68 determines that the short circuit portion S is not present in the limited range 74 having the synthesized resistance value of the resistance threshold value R0 or more.

In the above embodiment, the obtaining step may be performed in the state where the electrolyte membrane member 12 is energized. In this case, in the identifying step, the identification obtaining unit 60 identifies one of the plurality of limited ranges 74, and obtains the voltage value of the voltmeter 56 corresponding to the identified limited range 74.

In the above described embodiment, in the identifying step, the plurality of limited ranges 74 are identified one by one, and the voltage values of the plurality of divided portions 72 included in the identified limited range 74 are obtained. However, the present invention is not limited to this example. For example, in the obtaining step, in all of the limited ranges 74, the voltage values of the plurality of divided portions 72 included in each of the limited ranges 74 may be obtained at the same time.

The embodiment is summarized as follows:

The above embodiment discloses a method of inspecting short circuit of the electrolyte membrane (16). The method is performed by energizing the electrolyte membrane member (12) having a solid polymer electrolyte membrane, for inspecting whether or not a short circuit portion (S) is present in the electrolyte membrane. The method includes an energizing step of energizing a plurality of divided portions (72) formed by dividing the electrolyte membrane member in a surface direction, through the pair of measurement terminal units (36, 40) disposed on both surfaces of the electrolyte membrane member, an obtaining step of performing a process of obtaining the energization state for each of a plurality of limited ranges (74) provided at different positions of the electrolyte membrane member, each of the limited ranges including divided portions that are adjacent to each other in a range which is smaller than the entire range of the plurality of divided portions, and a determining step of determining whether or not the short circuit portion is present in the electrolyte membrane based on the energization state of the plurality of limited ranges obtained in the obtaining step.

In the method of inspecting the electrolyte membrane, the limited ranges that are closest to each other, among the plurality of limited ranges may be shifted from each other by one of the plurality of divided portions.

In the method of inspecting the electrolyte membrane, in the obtaining step, the identifying step of identifying one of the plurality of limited ranges and obtaining the energization state in the identified limited range may be performed a plurality of times, and in the identifying step, a limited range at a position shifted from the previously identified limited range in the surface direction by one of the plurality of divided portions may be identified.

In the method of inspecting the electrolyte membrane, in the identifying step, the voltage value of each of the plurality of divided portions included in the identified limited range may be obtained, the obtaining step may include a synthesized voltage calculating step of calculating a synthesized voltage value obtained by synthesizing voltage values of the plurality of divided portions included in the plurality of limited ranges, respectively, and in the determining step, it may be determined whether or not the short circuit portion is present in the electrolyte membrane based on the synthesized voltage value.

In the method of inspecting short circuit of the electrolyte membrane, the obtaining step may include a synthesized resistance calculating step of calculating a synthesized resistance value of each of the plurality of limited ranges based on the synthesized voltage value, and in the determining step, in the case where the synthesized resistance value which is the lowest among the synthesized resistance values of the plurality of limited ranges is lower than a resistance threshold value (R0), it may be determined that the short circuit portion is present adjacent to the center of the limited range having the lowest synthesized resistance value.

In the method of inspecting short circuit of the electrolyte membrane, in the obtaining step, a synthesized resistance value of each of the plurality of limited ranges may be calculated based on the synthesized voltage value, and in the determining step, it may be determined that the short circuit portion is present in the limited range having a synthesized resistance value which is lower than a resistance threshold value.

In the method of inspecting short circuit of the electrolyte membrane, at the time of energizing the electrolyte membrane member through the pair of measurement terminal units, an average value of voltage values of the plurality of divided portions which are not more than a background voltage threshold value (V0) may be calculated as a background voltage, and the size of the limited range may be determined based on a correction voltage value obtained by subtracting the background voltage from each of the voltage values of the plurality of divided portions.

In the method of inspecting short circuit of the electrolyte membrane, at the time of measuring voltage values of the plurality of divided portions positioned around a short circuit portion which is identified beforehand and calculating a synthesized voltage value while increasing the number of synthesized voltage values, the size of the limited range may be set in the ranges of the plurality of divided portions when the amount of change of the synthesized voltage value becomes not more than a predetermined value.

The above embodiment discloses an apparatus (10) for inspecting short circuit of an electrolyte membrane by energizing an electrolyte membrane member having the solid polymer electrolyte membrane, for inspecting whether or not a short circuit portion is present in the electrolyte membrane. The apparatus includes a first measurement terminal unit (36) and a second measurement terminal unit (40) configured to hold the electrolyte membrane member, a power supply (44) configured to cause energization between the first measurement terminal unit and the second measurement terminal unit, an obtaining unit (60) configured to obtain an energization state of the electrolyte membrane member, and a determining unit (68) configured to determine whether or not the short circuit portion is present in the electrolyte membrane based on the energization state obtained by the obtaining unit. A plurality of the first measurement terminal units are disposed in a state where the first measurement terminal units are insulated from each other. The obtaining unit is configured to obtain the energization state of a limited range including divided portions that are adjacent to each other in a range which is smaller than the entire range of a plurality of divided portions of the electrolyte membrane member facing the first measurement terminal unit.

What is claimed is:

1. A method of inspecting short circuit of an electrolyte membrane, the method being performed by energizing an electrolyte membrane member having a solid polymer electrolyte membrane, for inspecting whether or not a short circuit portion is present in the electrolyte membrane, the method comprising the steps of:
   energizing a plurality of divided portions formed by dividing the electrolyte membrane member in a surface direction, through a pair of measurement terminal units disposed on both surfaces of the electrolyte membrane member;
   performing a process of obtaining an energization state for each of a plurality of limited ranges provided at different positions of the electrolyte membrane member, each of the limited ranges including divided portions that are adjacent to each other in a range which is smaller than the entire range of the plurality of divided portions; and
   determining whether or not the short circuit portion is present in the electrolyte membrane based on the energization state of the obtained plurality of limited ranges.

2. The method of inspecting the electrolyte membrane according to claim 1, wherein the limited ranges that are closest to each other, among the plurality of limited ranges are shifted from each other by one of the plurality of divided portions.

3. The method of inspecting the short circuit of the electrolyte membrane according to claim 2, wherein
   in obtaining the energization state, one of the plurality of limited ranges is identified, and the energization state in the identified limited range is obtained a plurality of times, and
   in identifying the limited range, a limited range at a position shifted from the previously identified limited range in the surface direction by one of the plurality of divided portions is identified.

4. The method of inspecting the short circuit of the electrolyte membrane according to claim 3, wherein
   in identifying the limited range, the voltage value of each of the plurality of divided portions included in the identified limited range is obtained,
   in obtaining the energization state, a synthesized voltage value obtained by synthesizing voltage values of the plurality of divided portions included in the plurality of limited ranges, respectively is calculated; and
   in determining whether or not the short circuit portion is present, it is determined whether or not the short circuit portion is present in the electrolyte membrane based on the synthesized voltage value.

5. The method of inspecting short circuit of the electrolyte membrane according to claim 4, wherein in obtaining the energization state, a synthesized resistance value of each of the plurality of limited ranges is calculated based on the synthesized voltage value; and
   in determining whether or not the short circuit portion is present, in a case where the synthesized resistance value which is a lowest among the synthesized resistance values of the plurality of limited ranges is lower than a resistance threshold value, it is determined that the short circuit portion is present adjacent to a center of the limited range having the lowest synthesized resistance value.

6. The method of inspecting short circuit of the electrolyte membrane according to claim 4, wherein
in obtaining the energization state, a synthesized resistance value of each of the plurality of limited ranges is calculated based on the synthesized voltage value;
in determining whether or not the short circuit portion is present, it is determined that the short circuit portion is present in the limited range having a synthesized resistance value which is lower than a resistance threshold value.

7. The method of inspecting the electrolyte membrane according to claim 1, wherein
at the time of energizing the electrolyte membrane member through the pair of measurement terminal units, an average value of voltage values of the plurality of divided portions which are not more than a background voltage threshold value is calculated as a background voltage, and the size of the limited range is set based on a correction voltage value obtained by subtracting the background voltage from each of the voltage values of the plurality of divided portions.

8. The method of inspecting the electrolyte membrane according to claim 7, wherein at a time of measuring voltage values of the plurality of divided portions positioned around a short circuit portion which is identified beforehand and calculating a synthesized voltage value while increasing a number of synthesized voltage values, the size of the limited range is set in the ranges of the plurality of divided portions when the amount of change of the synthesized voltage value becomes not more than a predetermined value.

9. An apparatus for inspecting short circuit of an electrolyte membrane by energizing an electrolyte membrane member having a solid polymer electrolyte membrane, for inspecting whether or not a short circuit portion is present in the electrolyte membrane,
the apparatus comprising:
a first measurement terminal unit and a second measurement terminal unit configured to hold the electrolyte membrane member;
a power supply configured to cause energization between a first measurement terminal unit and a second measurement terminal unit; and
one or more processors configured to execute an instruction which is stored in a memory and executable by a computer,
wherein the instruction which is executable by the computer is executed by the one or more processors in a manner the short circuit inspection apparatus obtains the energization state of the electrolyte membrane member, and determines whether or not the short circuit portion is present in the electrolyte membrane based on the obtained energization state; and
a plurality of the first measurement terminal units are disposed in a state where the first measurement terminal units are insulated from each other, and
the one or more processors are configured to cause the short circuit inspection apparatus to perform a process of obtaining the energization state for each of a plurality of limited ranges provided at different positions of the electrolyte membrane member, each of the limited ranges including divided portions that are adjacent to each other in a range which is smaller than the entire range of a plurality of divided portions of the electrolyte membrane member facing the first measurement terminal units.

* * * * *